(12) United States Patent
Kim et al.

(10) Patent No.: US 6,187,615 B1
(45) Date of Patent: Feb. 13, 2001

(54) CHIP SCALE PACKAGES AND METHODS FOR MANUFACTURING THE CHIP SCALE PACKAGES AT WAFER LEVEL

(75) Inventors: Nam Seog Kim, Kyungki-do; Dong Hyeon Jang; Sa Yoon Kang, both of Seoul; Heung Kyu Kwon, Kyungki-do, all of (KR)

(73) Assignee: Samsung Electronics Co., Ltd., Suwon (KR)

( * ) Notice: Under 35 U.S.C. 154(b), the term of this patent shall be extended for 0 days.

(21) Appl. No.: 09/222,250

(22) Filed: Dec. 28, 1998

(30) Foreign Application Priority Data

Aug. 28, 1998 (KR) .................................. 98-35175

(51) Int. Cl.⁷ .................................. H01L 21/44
(52) U.S. Cl. ..................... 438/113; 438/108; 257/737
(58) Field of Search ................... 257/737, 738; 438/113, 613, 108, 778

(56) References Cited

U.S. PATENT DOCUMENTS 5,547,906 * 8/1996 Badehi .................................. 437/227
5,903,044 * 5/1999 Farnworth et al. .................. 257/620
5,904,546 * 5/1999 Wood et al. .......................... 438/460

OTHER PUBLICATIONS

Mis et. al. (MCNC) 1996 ISHM Proceedings.
B. Rogers/D. Scheck; Solder Bumping/Redistribution using Photo–BCB (Cyclotene 4024) Delco Electronics (Kokomo) and Flip Chip Technologies (Pheonix) Nov. 12, 1996 (4 Pages).

Sandia's mini BGA; ®1994 TechSearch International, Inc. pp. 9 & 10.

M. Topper, J. Simon and H. Reichl *Technical University of Berlin*; Redistribution Technology For Chip Scale Package Using Photosensitive BCB—Future Fab International publication pp. 363–368.

Dietrich Tonnles, Michael Topper, Jügen Wolf, Gunter Engelmann and Herbert Reichl; Mask aligners in advanced packaging—published in Solid State Technology (Mar. 1998).

* cited by examiner

Primary Examiner—Roy Potter
(74) Attorney, Agent, or Firm—Skjerven Morrill MacPherson LLP; David T. Miller

(57) ABSTRACT

In accordance with the present invention, a chip scale package (CSP) is manufactured at wafer-level. The CSP includes a chip, a conductor layer for redistribution of the chip pads of the chip, one or two insulation layers and multiple bumps, which are interconnected to respective chip pads by the conductor layer and are the terminals of the CSP. In addition, in order to improve the reliability of the CSP, a reinforcing layer, an edge protection layer and a chip protection layer is provided. The reinforcing layer absorbs stress applied to the bumps when the CSP are mounted on a circuit board and used for an extended period, and extends the life of the bumps, and thus, the life of the CSP. The edge protection layer and the chip protection layer prevent external force from damaging the CSP. After forming all elements constituting the CSP on the semiconductor wafer, the semiconductor wafer is sawed to produce individual CSPs.

20 Claims, 12 Drawing Sheets

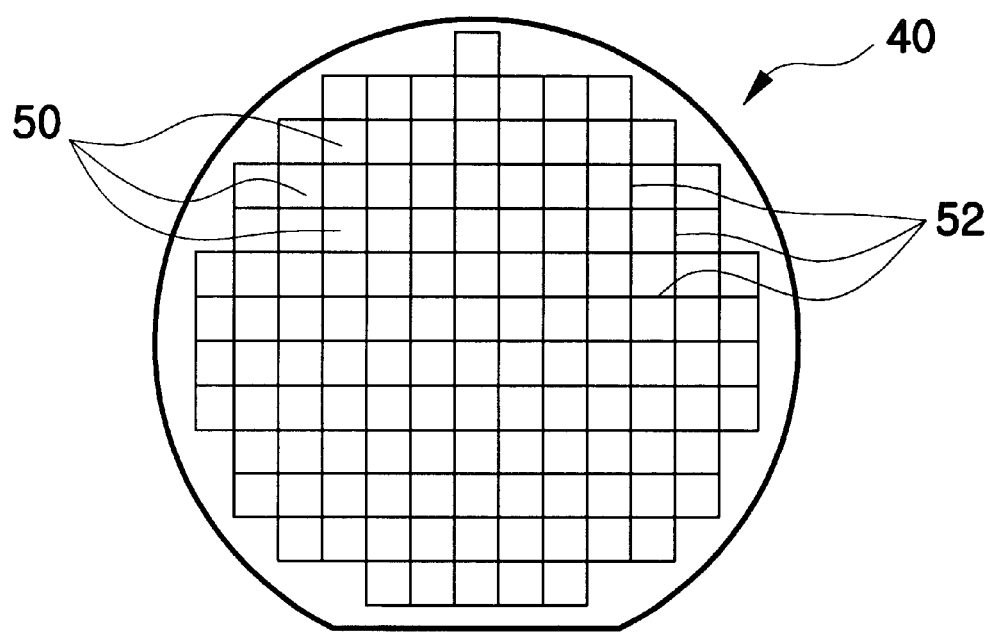
< FIG. 1 >

< FIG. 2 >
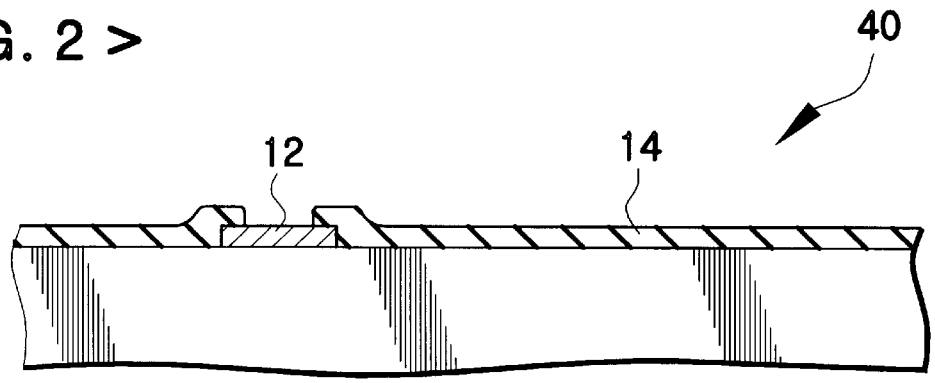
< FIG. 3 >
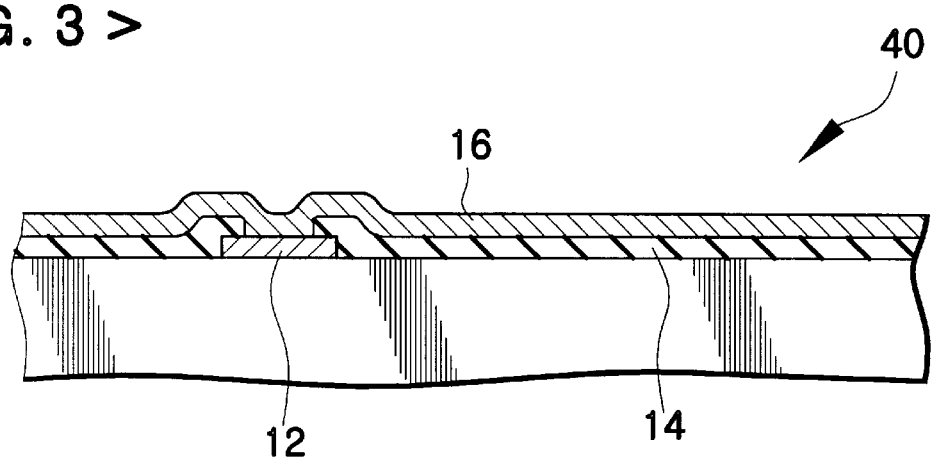
< FIG. 4 >
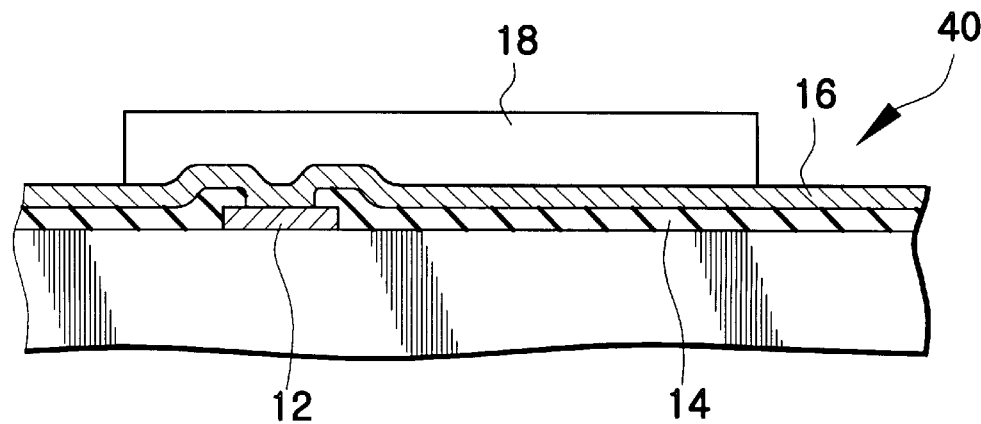

< FIG. 5 >
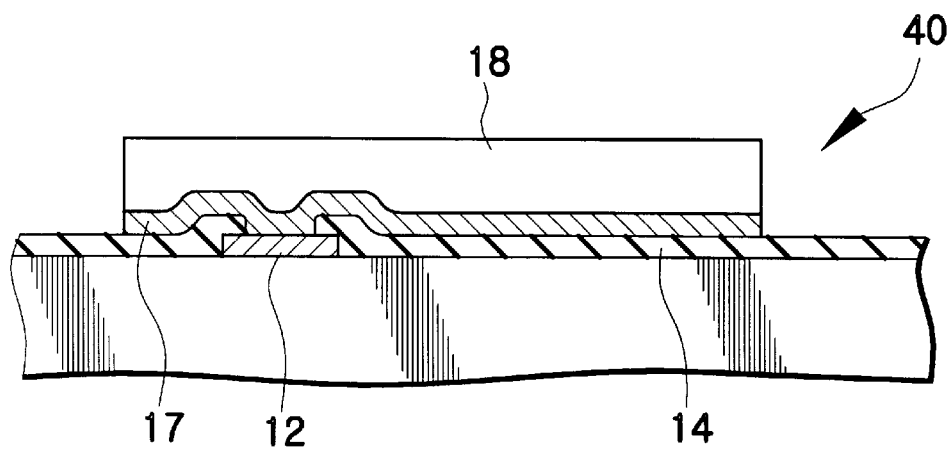
< FIG. 6 >
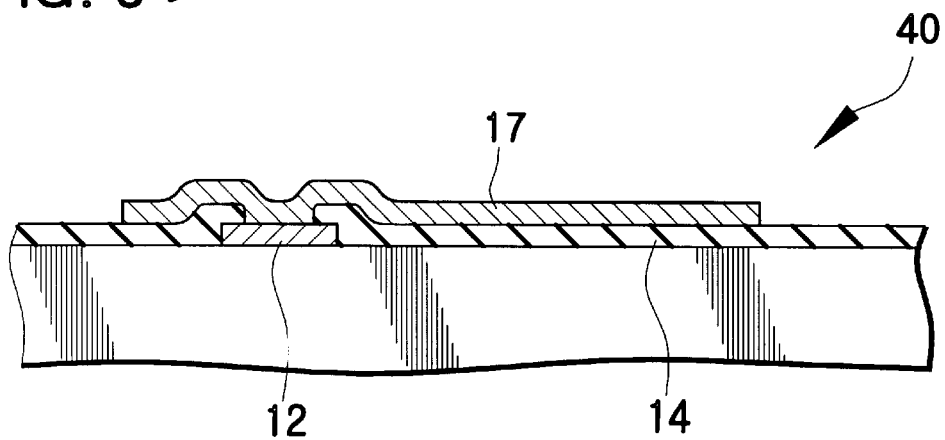

< FIG. 7 >
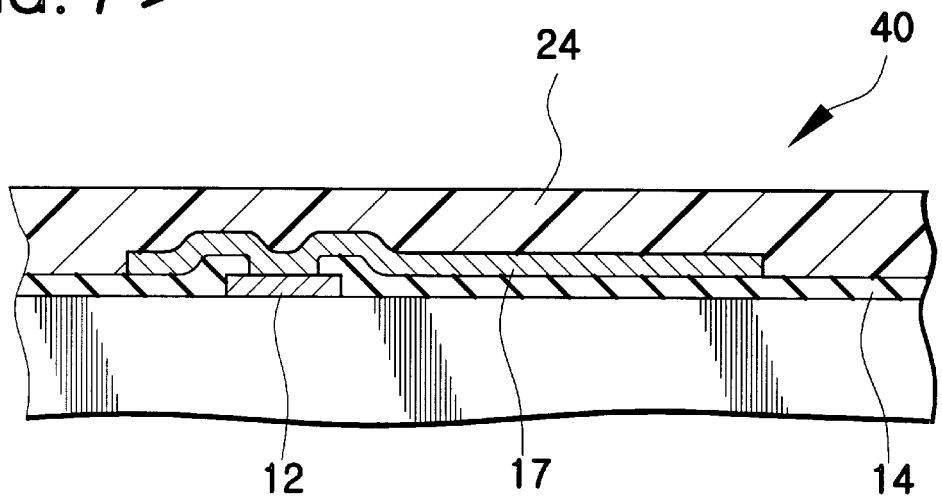
< FIG. 8 >
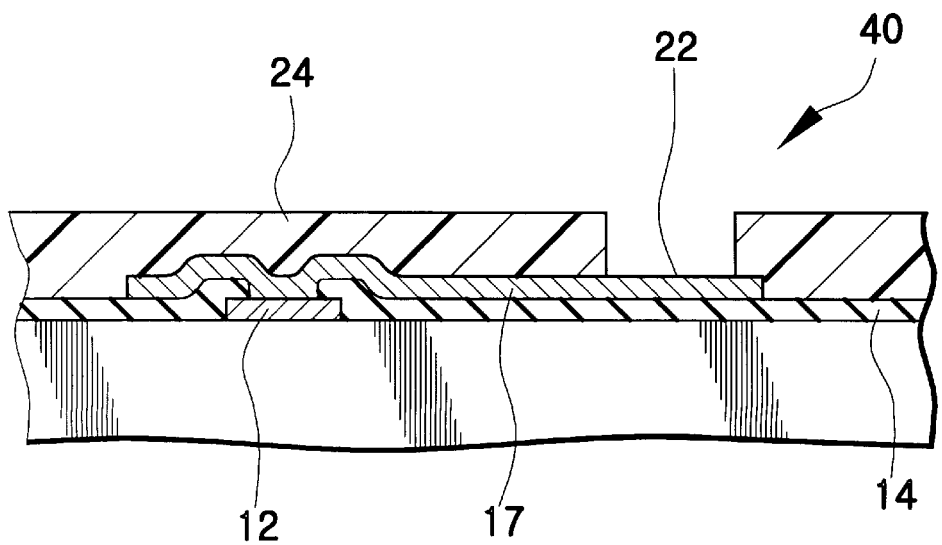

< FIG. 9 >
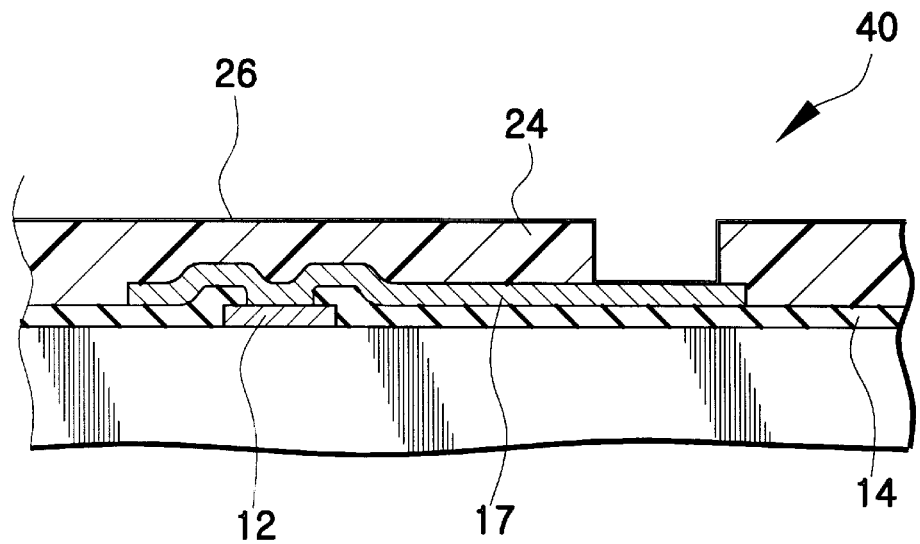
< FIG. 10 >
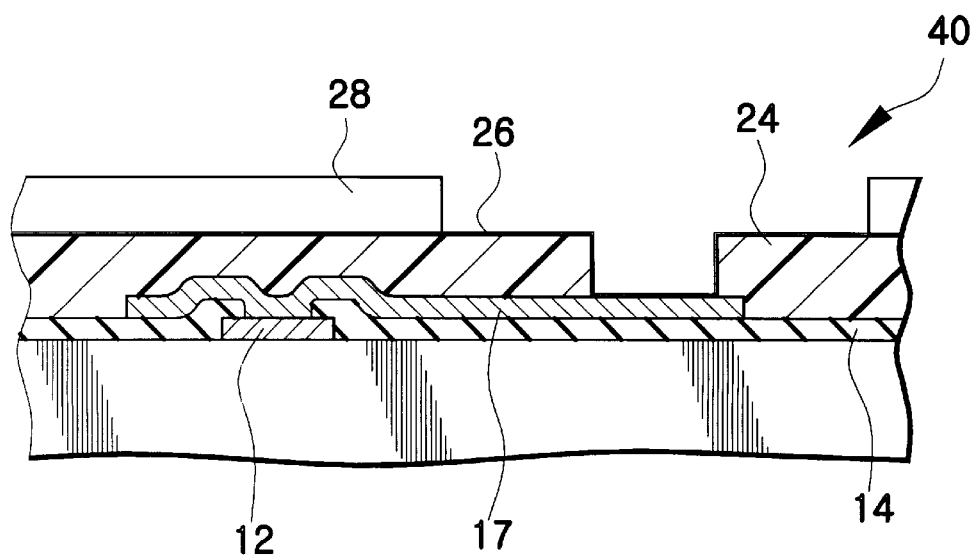

< FIG. 11 >
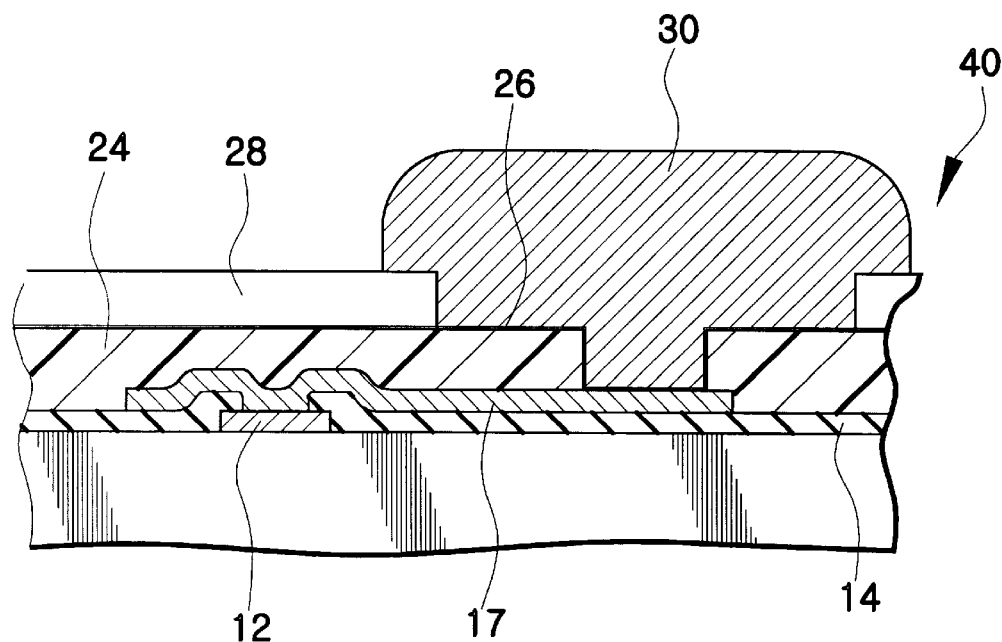
< FIG. 12 >
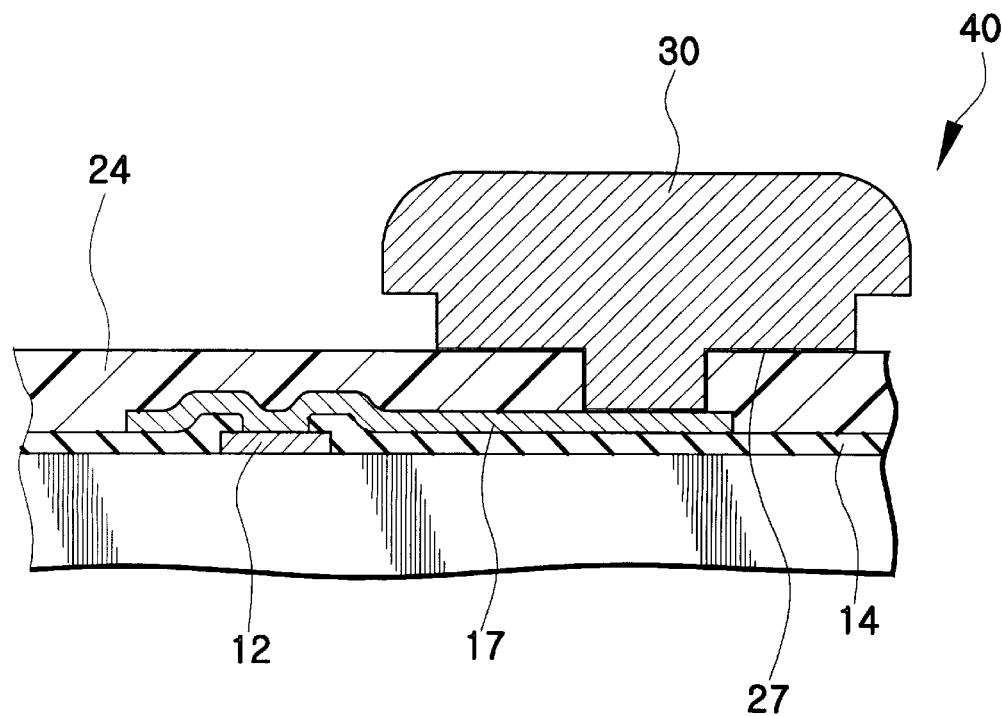

< FIG. 13 >
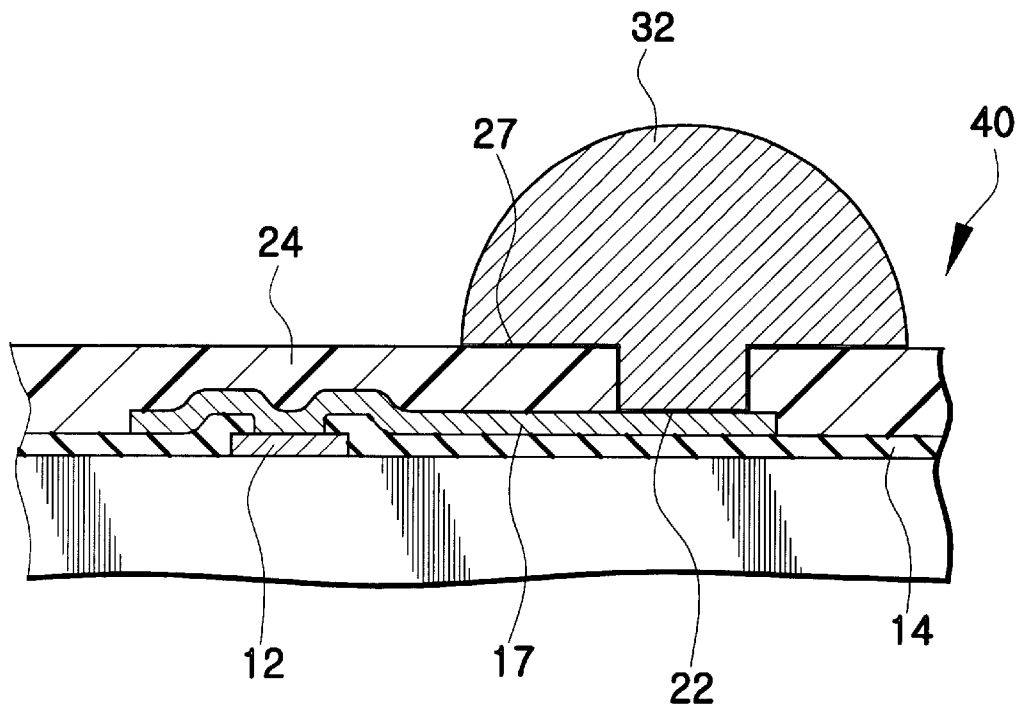
< FIG. 14 >
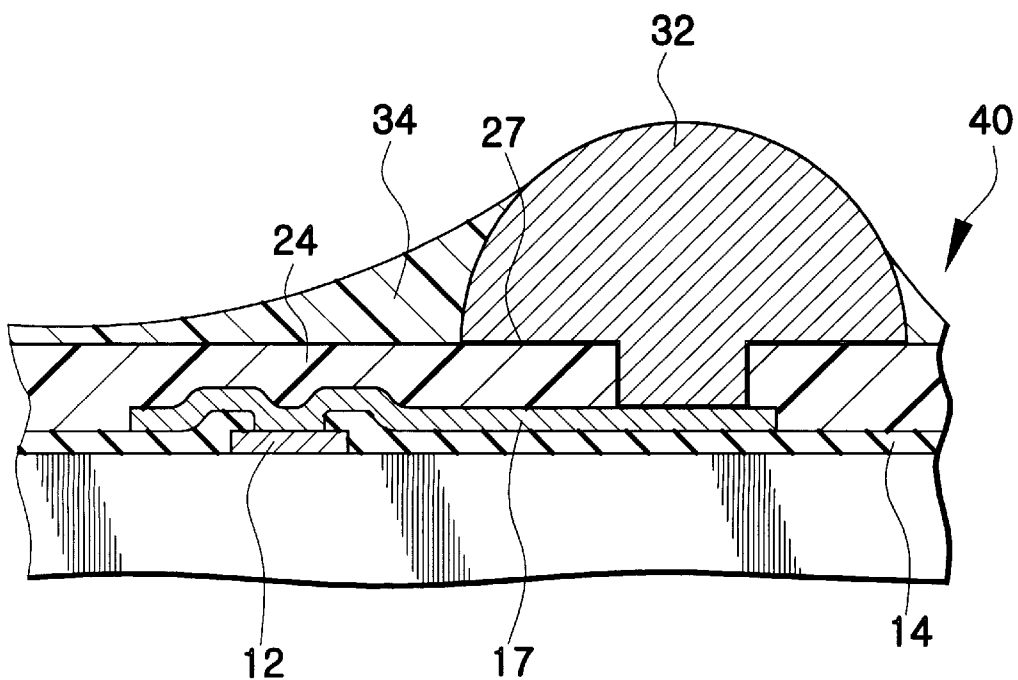

< FIG. 15 >
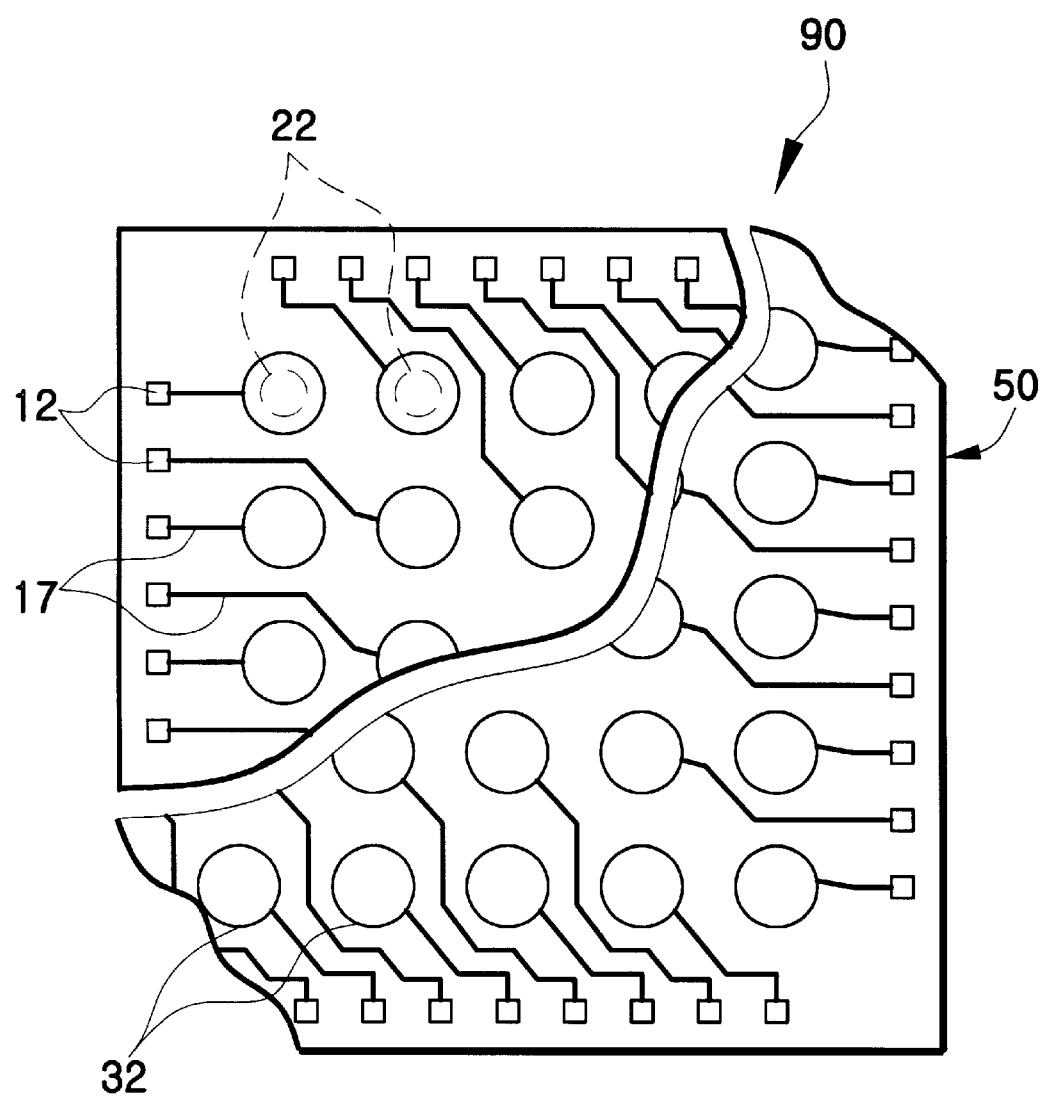

< FIG. 16 >
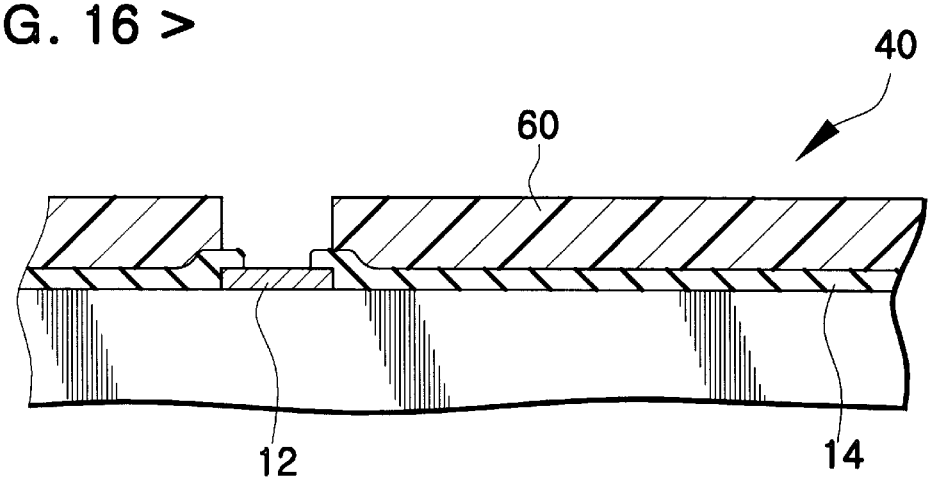
< FIG. 17 >
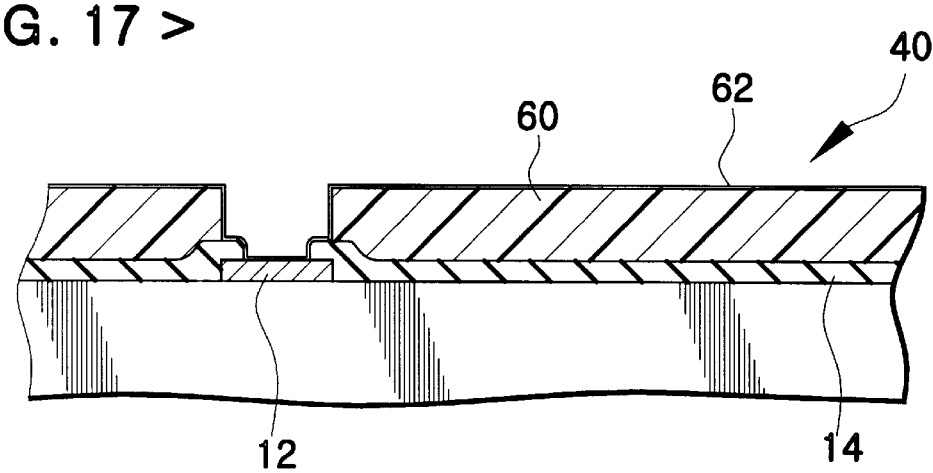
< FIG. 18 >
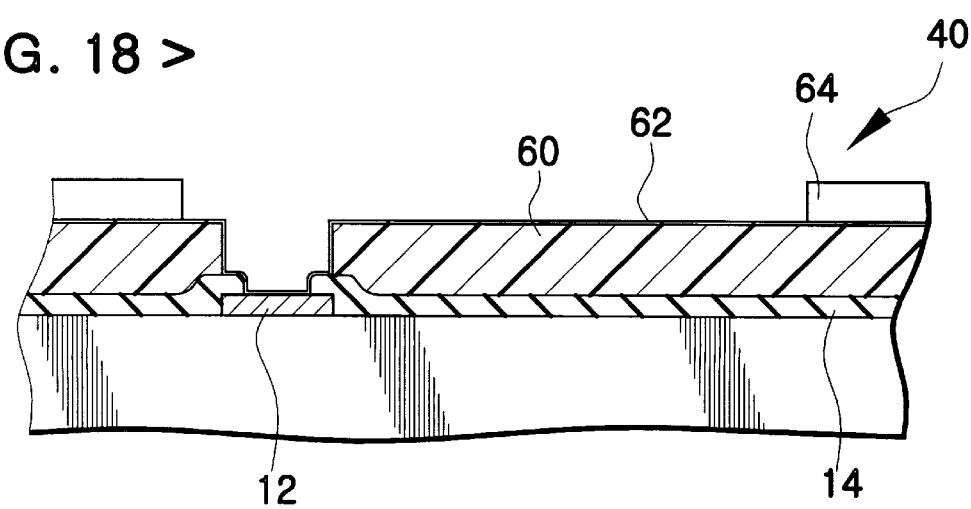

< FIG. 19 >
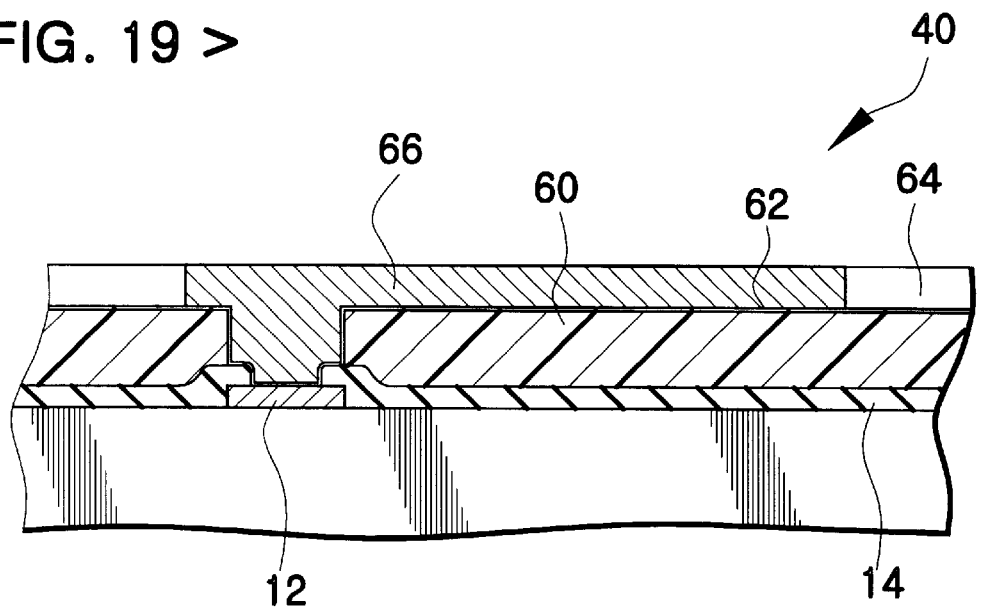
< FIG. 20 >
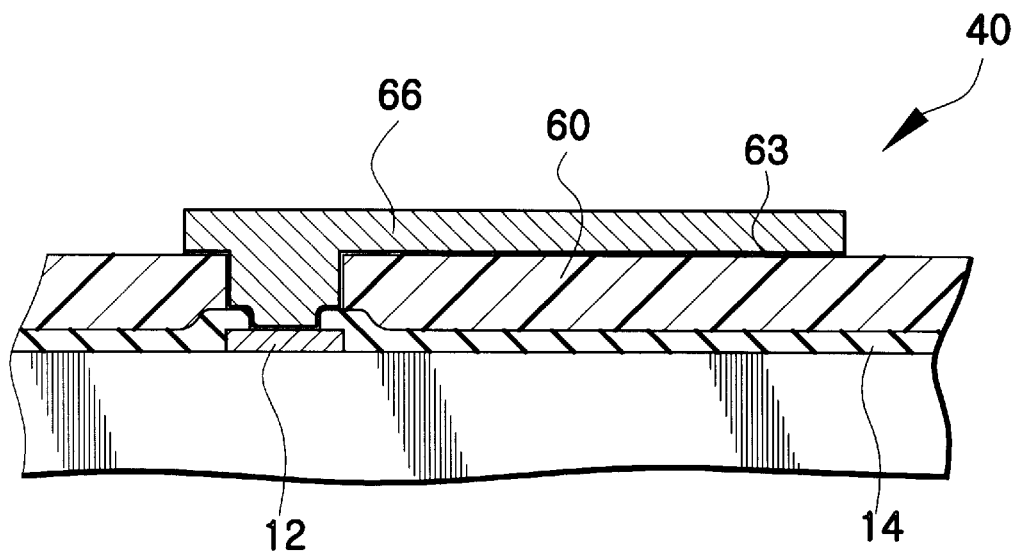

< FIG. 21 >
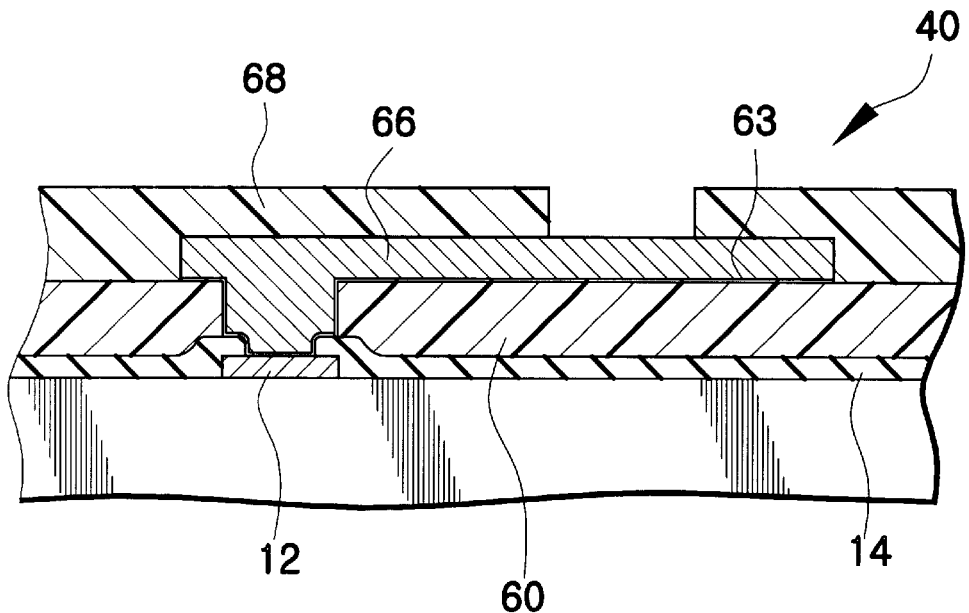
< FIG. 22 >
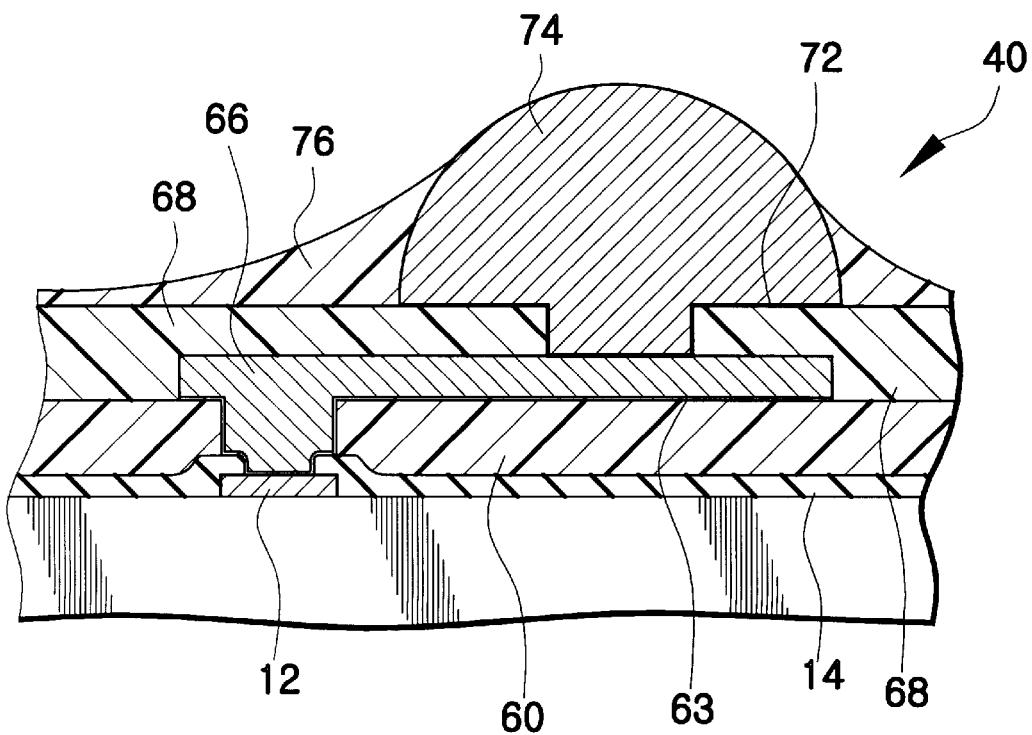

< FIG. 23 >
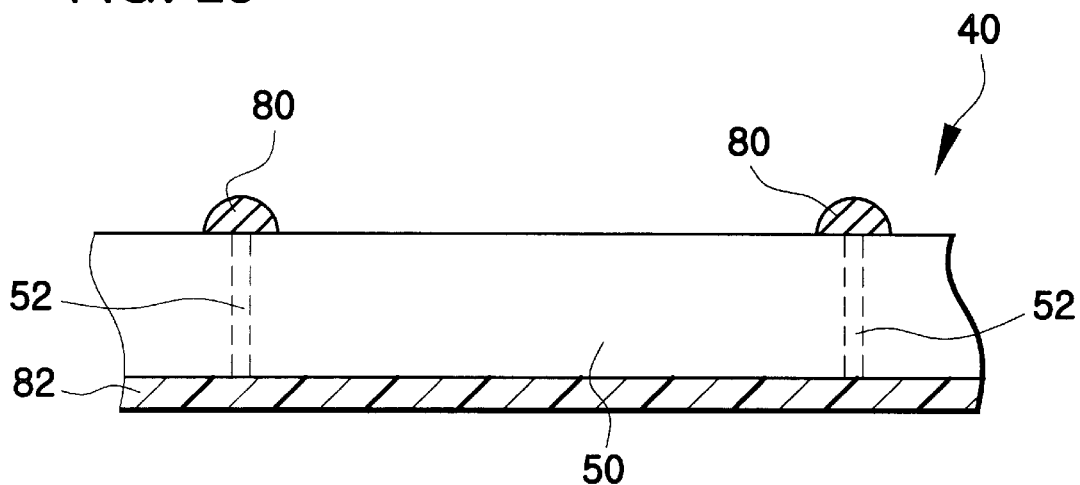
< FIG. 24 >
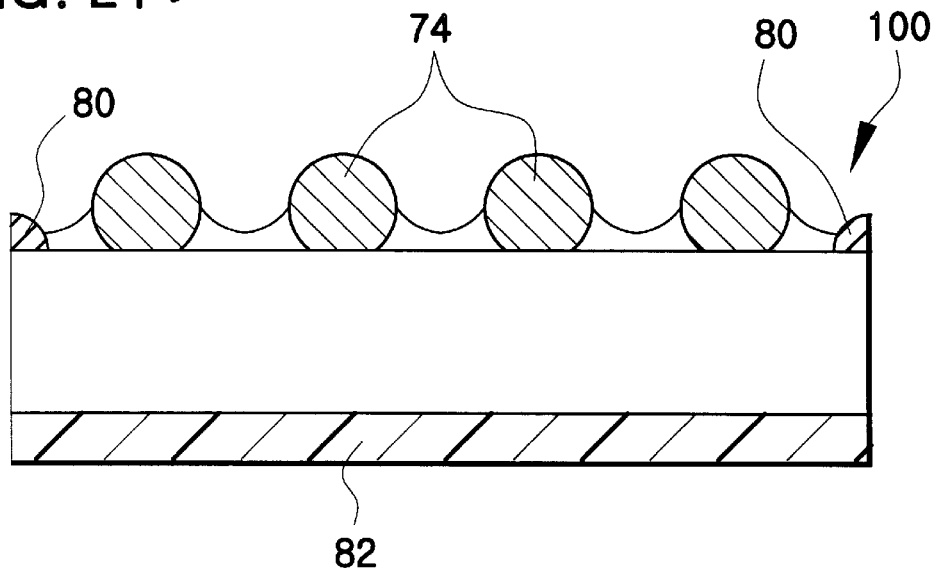
< FIG. 25 >
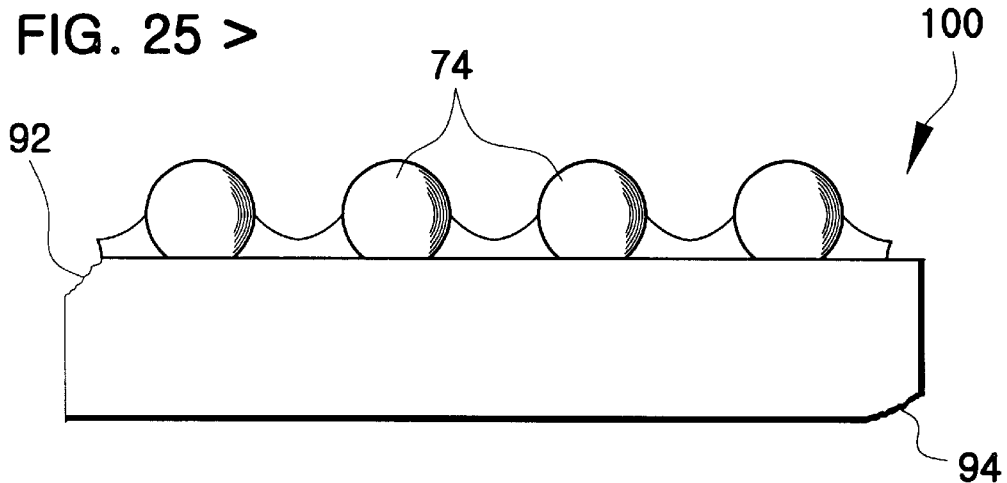

CHIP SCALE PACKAGES AND METHODS FOR MANUFACTURING THE CHIP SCALE PACKAGES AT WAFER LEVEL

BACKGROUND

1. Field of the Invention

This invention relates to chip scale packages and methods for manufacturing the packages at wafer level.

2. Description of Related Art

Miniaturization of electronic devices, which is one of major trends in the electronics industry, has led to the development of many technologies for manufacturing small packages, especially packages that have almost the same size as semiconductor integrated circuit chips. The Joint Electronic Device Engineering Council (JEDEC) has proposed the name 'Chip Scale Package (CSP)' for a type of small packages. JEDEC's definition of the CSP is a package having an outline that is 1.2 times or less than the outline of the semiconductor chip included in the package.

Many companies and institutes have developed their own CSP manufacturing technologies, and some have commercialized their own technologies or products. However, most of the newly developed CSPs have several drawbacks in the areas of product reliability, process reliability and manufacturing cost, when compared to plastic packages which are well established in the semiconductor industry. Therefore, for commercializing CSPs widely and successfully, new CSPs that have better process and product reliability and lower manufacturing costs are sought.

SUMMARY

In accordance with the present invention, a chip scale package (CSP) is manufactured at wafer-level. The CSP includes a conductor layer for redistribution of the chip pads on a semiconductor chip, one or two insulation layers and solder bumps which function as the terminals of the CSP and are interconnected to respective chip pads by the conductor layer. In one embodiment, the conductor layer is formed directly on the surface or passivation layer of the semiconductor wafer, and in another embodiment, after an insulation layer is formed on the surface of the semiconductor wafer, the conductor layer is formed on the insulation layer. In both embodiments, another insulation layer is formed on the conductor layer, and additional metal layers can be formed between the chip pads and the conductor layer, and between the solder bumps and the conductor layer for improving the interface integrity.

In addition, in order to improve the reliability of the CSP, a reinforcing layer, an edge protection layer and a chip protection layer are provided. The reinforcing layer, which is formed on the top insulation layer, absorbs the stresses applied to solder bumps when a CSP is mounted on a circuit board and used for an extended period, and extends the life of the solder bumps. The edge protection layer is formed on the semiconductor wafer along the scribe lines on the semiconductor wafer, and the chip protection layer is form on the back of the semiconductor wafer. The edge protection layer and the chip protection layer prevent external forces from damaging the CSP. After forming all elements of the CSP on the semiconductor wafer, the semiconductor wafer is sawed to produce individual CSPs.

The CSP manufacturing method according to the present invention employs currently available technology and thus, does not require development of new technology or equipment. Further, the wafer-level CSP manufacturing of the invention is more productive than a chip-level CSP manufacturing which fabricates CSPs one chip at a time after sawing a semiconductor wafer into integrated circuit chips.

BRIEF DESCRIPTIONS OF THE DRAWINGS

FIG. 1 is a schematic top view of a semiconductor wafer which includes semiconductor integrated circuit chips and scribe lines formed thereon.

FIG. 2 is a cross-sectional view of a part of the semiconductor wafer in FIG. 1.

FIG. 3 shows the structure of FIG. 2 after formation of a metal layer on the surface of the semiconductor wafer.

FIG. 4 shows the structure of FIG. 3 after formation of a patterned photoresist layer on the metal layer.

FIG. 5 shows the structure of FIG. 4 after etching of the metal layer using the patterned photoresist layer as a mask to produce a patterned conductor layer.

FIG. 6 shows the structure of FIG. 5 after removal of the patterned photoresist layer.

FIG. 7 shows the structure of FIG. 6 after formation of an insulation layer on the entire surface of the semiconductor wafer including the patterned conductor layer.

FIG. 8 shows the structure of FIG. 7 after formation of openings so that the patterned conductor layer is exposed where metal bumps will be connected to the patterned conductor layer.

FIG. 9 shows the structure of FIG. 8 after formation of a barrier layer on the entire surface of the semiconductor wafer.

FIG. 10 shows the structure of FIG. 9 after formation of another photoresist layer so that the openings of insulation layer and part of insulation layer surrounding the openings are exposed.

FIG. 11 shows the structure of FIG. 10 after formation of intermediate bumps on the area that is not covered with the photoresist layer.

FIG. 12 shows the structure of FIG. 11 after removal of the photoresist layer.

FIG. 13 shows the structure of FIG. 12 after removal of the barrier layer.

FIG. 14 shows the structure of FIG. 13 after formation of a reinforcing layer on the insulation layer and an illustrative cross-sectional view of a CSP according to an embodiment of the invention.

FIG. 15 is a schematic bottom view of a CSP in accordance with the invention.

FIG. 16 shows the structure after formation of a lower insulation layer on the entire surface of the semiconductor wafer except on chip pads.

FIG. 17 shows the structure of FIG. 16 after formation of an adhesion layer on the entire surface of the semiconductor wafer.

FIG. 18 shows the structure of FIG. 17 after formation of a patterned photoresist layer on the adhesion layer.

FIG. 19 shows the structure of FIG. 18 after formation of a patterned conductor layer on the adhesion layer where the patterned photoresist layer is absent.

FIG. 20 show the structure of FIG. 19 after removal of the patterned photoresist layer and the adhesion layer under the patterned photoresist layer.

FIG. 21 shows the structure of FIG. 20 after formation of an upper insulation layer on the entire surface of the semiconductor wafer except where solder bumps are to be formed.

FIG. 22 shows the structure of FIG. 21 after formation of a reinforcing layer on the upper insulation layer and a illustrative cross-sectional view of a CSP according to another embodiment of the invention.

FIG. 23 shows a part of a semiconductor wafer including an edge protection layer and a chip protection layer in accordance with the present invention.

FIG. 24 is a cross-sectional view of a CSP sawed from the semiconductor wafer in FIG. 23.

FIG. 25 is a cross-sectional view of a CSP having damage that can occur in the absence of an edge protection layer and a chip protection layer.

Use of the same reference symbols in different figures indicates similar or identical items.

DETAILED DESCRIPTION OF THE PREFERRED EMBODIMENTS

The present invention provides CSPs that include several features that can improve reliability of the packages, and a wafer-level manufacturing method for the CSPs.

FIGS. 2 to 14 illustrate a CSP and a method for manufacturing the CSP in accordance with an embodiment of the present invention. Particularly, FIG. 14 shows a partial cross-sectional view of the CSP.

As shown in FIG. 1, manufacturing of the CSP in FIG. 14 begins with a semiconductor wafer 40 having a number of semiconductor integrated circuit chips 50 and scribe lines 52 between semiconductor chips 50. FIG. 2 is a cross-sectional view of a part of semiconductor wafer 40 showing a chip pad 12 and a passivation layer 14 of a semiconductor chip 50. Chip pad 12 is one of many chip pads that connect to the circuitry (not shown) of semiconductor chip 50, and provides access for external electrical connections. Since fabrication of semiconductor wafer 40 in FIG. 1 is a well known technology, a detailed explanation of the fabrication is not made here.

With reference to FIG. 3, a metal layer 16 is formed on the entire surface of semiconductor wafer 40 including chip pad 12 and passivation layer 14, so that an electrical interconnection between metal layer 16 and chip pad 12 is made. The thickness of metal layer 16 is greater than that of a metal layer (not shown) which constitutes a chip circuit pattern below passivation layer 14, and is preferably 1 to 5 $\mu$m. Metal layer 16 can be made of a various kinds of materials including, but not limited to, copper, aluminum, nickel, copper alloys, aluminum alloys and nickel alloys.

After forming metal layer 16 on the surface of semiconductor wafer 40, patterning of metal layer 16 to form a patterned conductor layer 17 follows, as illustrated in FIGS. 4 to 6. First, as shown in FIG. 4, a patterned photoresist layer 18 is formed on metal layer 16. Patterned photoresist layer 18 covers only the area that will constitute patterned conductor layer 17. Then, etching of metal layer 16 (FIG. 5) and removal of patterned photoresist layer 18 (FIG. 6) leave patterned conductor layer 17, which has a pattern according to a re-distribution plan of chip pads 12.

An alternative method of forming patterned conductor layer 17 is direct screen-printing of conductor paste (not shown) on chip pad 12 and passivation layer 14, and curing the paste to produce patterned conductor layer 17. An exemplary paste can be a mixture of metal particles and binding resin.

FIG. 7 shows an insulation layer 24 formed on the entire surface of semiconductor wafer 40 after formation of patterned conductor layer 17. Insulation layer 24 becomes a part of CSP in FIG. 14, and therefore, should have desirable characteristics, for example, low moisture absorption ratio, low dielectric constant and low thermal expansion coefficient. Considering these properties, BCB (BenzoCycloButene) is suitable for insulation layer 24. As well as BCB, other polymers, for example, polyimide and epoxy, and inorganic materials, for example, silicon nitride, silicon dioxide and a combination of silicon nitride and silicon dioxide can be used for insulation layer 24. A conventional spin-coating method can form the polymer insulation layer, and a conventional chemical vapor deposition method can form the inorganic insulation layer. In both cases, the thickness of the insulation layer is preferably 2 to 50 $\mu$m.

Referring to FIG. 8, insulation layer 24 is partly removed to form openings for bump pads 22, which are parts of patterned conductor layer 17 exposed through the openings. Bump pads 22 can be said to be re-distributed chip pads 12, and location of bump pads 22 depends on the design of a board to which a CSP including bump pads 22 will be surface-mounted.

After the formation of the openings, a metallic barrier layer 26 is formed covering insulation layer 24 and bump pads 22 as shown in FIG. 9. Barrier layer 26 not only prevents the diffusion between patterned conductor layer 17 and bumps 32 in FIG. 14, but also enhances the adhesion between patterned conductor layer 17 and bump 32. Further, barrier layer 26 provides an electrical supply medium in electroplating metals for bumps 32 on bump pads 22. Barrier layer 26 usually includes two or three sub-layers, and for example, includes a structure of titanium/copper, titanium/titanium-copper/copper, chromium/chromium-copper/copper, titanium-tungsten/copper, aluminum/nickel/copper or aluminum/nickel-vanadium/copper. In forming titanium/titanium-copper/copper or chromium/chromium-copper/copper structure, sputtering equipment employs two targets simultaneously to form a middle titanium-copper layer or chromium-copper layer of the structure. An adhesion layer (not shown), which has the same structure as barrier layer 26 can be formed between chip pads 12 and metal layer 16 before the formation of metal layer 16 in FIG. 3. The thickness of barrier layer 26 and the adhesion layer is 1 $\mu$m or less, preferably 0.8~1.0 $\mu$m.

On barrier layer 26, as shown in FIG. 10, another photoresist layer 28 is formed so that the openings in insulation layer 24 and areas surrounding the openings are exposed. Then, a metal for bumps 32, preferably, of a solder alloy, is plated to form intermediate bumps 30 on the area that is not covered with photoresist layer 28 as FIG. 11 shows. Instead of the plating method, screen-printing of solder paste, placement of pre-formed solder balls or metaljet method, which sprays liquid solder at the openings in the insulation layer, can also produce intermediate bumps 30. Before forming intermediate solder bump 30, a copper layer (not shown) can be formed several $\mu$m to tens of $\mu$m thick on barrier layer 26 of bump pads 22 to prevent reliability problems caused by diffusion between intermediate solder bump 30 and barrier layer 26 during a reflow process which melts intermediate solder bump 30 to reshape to solder bump 32.

After the formation of intermediate solder bumps 30, photoresist layer 28 and barrier layer 26 are removed by etching, and only barrier metal part 27 under intermediate solder bumps 30 remains as FIG. 12 shows. Then, a conventional reflow method reshapes intermediate solder bumps 30 to solder bumps 32 as depicted in FIG. 13. In this embodiment, the height of solder bumps 32 is between 350 $\mu$m and 500 $\mu$m.

Further, as shown in FIG. 14, a reinforcing layer 34 can be formed on insulation layer 24 to support solder bumps 32. Reinforcing layer 34 absorbs stresses applied to solder bumps 32 when CSP is mounted on a circuit board (not shown) and used for an extended period. Failure caused by such stress is a common problem in prior CSPs For forming cover layer 34, a liquid polymer that has low viscosity can be dispensed and cured. The low viscosity of the liquid polymer allows surface tension to draw the polymer up the side of bump 31 and creates a concave support of bump 32. A polymer with higher flexural strength, after being cured, is preferable, because the higher the flexural strength is, the more stress reinforcing layer 34 can absorb from solder bumps 32. Reinforcing layer 34 should not cover the top of solder bumps 32. It is preferable that reinforcing layer 34 meets solder bumps 32 at a point that is lower than the top of solder bumps 32 by ¼ of solder bump height.

Finally, semiconductor wafer 40 that went through the steps illustrated in FIGS. 2 to 14 is sawed along scribe lines 52 to produce individual CSPs 90 schematically shown in FIG. 15.

To provide more protection to CSPs from external shock and thermo-mechanical stresses applied to CSPs during actual use, another embodiment of the invention includes two insulation layers and additional protection layers. This embodiment is described with reference to FIG. 16 to 24.

Referring to FIG. 16, a lower insulation layer 60 is formed on semiconductor wafer 40 including chip pad 12 and passivation layer 14. After the formation of an insulation layer on the entire surface of semiconductor wafer 40, the insulation layer on chip pads 12 is etched to produce openings for further interconnection. A conventional etching method can remove the insulation layer on chip pads 12. Lower insulation layer 60 becomes a part of CSP in FIG. 22, and should have desirable characteristics, such as low moisture absorption ratio, low dielectric constant and low thermal expansion coefficient. Polymers such as BCB, polyimide and epoxy, and inorganic materials such as silicon nitride, silicon dioxide and a combination of silicon nitride and silicon dioxide can be used for lower insulation layer 60. Among these, BCB is preferred for lower insulation layer 60. The process for forming lower insulation layer 60 is basically the same as the process for forming insulation layer 24 as described above. The thickness of lower insulation layer 60 is preferably 2 to 50 μm.

After the formation of lower insulation layer, an adhesion layer 62 is formed covering lower insulation layer 60 and chip pads 12 as shown in FIG. 17.

Adhesion layer 62 enhances the adhesion between a patterned conductor layer 66 in FIG. 19 and chip pad 12. Adhesion layer 62 usually includes two or three sub-layers, such as titanium/copper, titanium/titanium-copper/copper, chromium/chromium-copper/copper, titanium-tungsten/copper, or aluminum/nickel/copper. The thickness of adhesion layer 62 is about 0.5 μm.

With reference to FIGS. 18 to 20, formation of patterned conductor layer 66 is explained. First, a patterned photoresist layer 64 is formed on lower insulation layer 60 including adhesion layer 62 thereon so that patterned photoresist layer 64 is absent where patterned conductor layer 66 will be formed. Then, a deposition method forms patterned conductor layer 66 on adhesion layer 62 where adhesion layer 62 is exposed through patterned photoresist layer 64. A stripping method removes patterned photoresist layer 64, and an etching method exposes adhesion layer 62. Patterned conductor layer 66 is made of a various kinds of materials including, but not limited to, copper, aluminum, nickel, copper alloys, aluminum alloys and nickel alloys. Alternatively, forming patterned conductor layer 66 can be accomplished in a manner similar to one explained above with reference to FIGS. 3 to 6.

As FIG. 21 shows, after the formation of patterned conductor layer 66, an upper insulation layer 68 is formed exposing portions of patterned conductor layer 66 where bumps 74 will be formed. Subsequently, a barrier layer 72, bumps 74 and a reinforcing layer 76 are formed producing a CSP shown in FIG. 22. The manufacturing steps from the formation of an upper insulation layer 68 to the formation of reinforcing layer 76 are the same as the steps described with reference to FIGS. 7 to 14. The features of upper insulation layer 68, barrier layer 72, bumps 74 and a reinforcing layer 76 are also the same as those described above.

The embodiment can further include more protection layers: an edge protection layer 80 and a chip protection layer 82. FIG. 23 shows edge protection layer 80 formed on semiconductor wafer 40 along scribe lines 52 and chip protection layer 82 formed on the back of semiconductor wafer 40. Sawing of semiconductor wafer 40 in FIG. 23 results in a CSP 100 in FIG. 24. In the absence of edge protection layer 80 and chip protection layer 82, wafer sawing and subsequent handling of CSP 100 can create defects in CSP 100 such as edge chipping shown in FIG. 25.

Edge protection layer 80 can be formed before the formation of bump 74 by screen-printing using a mask or dotting a polymer, for example, epoxy resin, and curing the polymer. Edge protection layer 80 is preferably wider than scribe lines 52, so that part of edge protection layer 80 remains on CSP 100 along the periphery as shown in FIG. 24. The height of edge protection layer 80 is smaller than that of bump 74. It is preferable that the height of edge protection layer 80 be smaller than ⅟₁₀ of the height of bump 74.

Chip protection layer 82 can be formed after finishing fabrication of a semiconductor wafer by spin-coating a polymer such as polyimide and epoxy on the back of the semiconductor wafer. A preferable thickness of chip protection layer is 2–50 μm.

CSPs made according to the present invention show many advantages over other CSPs in prior art. The advantages include enhanced solder bump reliability, protection of CSP by an edge protection layer and a chip protection layer, and improved manufacturability. The reinforcing layer absorbs the stresses applied to solder bumps when the CSP is mounted on a circuit board and used for an extended period, and extends the life of the solder bumps and thus, the life of the CSP. The edge protection layer and the chip protection layer prevent the CSP from being damage by external force. The CSP manufacturing method according to the present invention employs currently available technology and thus, does not require development of a new technology or equipment. Further, the wafer-level CSP manufacturing of the invention is more productive than a chip-level CSP manufacturing which produces a CSP after sawing a semiconductor integrated circuit chips.

Although the invention has been described with reference to particular embodiments, the description is an example of the invention's application and should not be taken as a limitation. Various adaptations and combinations of the features of the embodiments disclosed are within the scope of the invention as defined by the following claims.

We claim:

1. A method for manufacturing a semiconductor package, comprising:

providing a semiconductor wafer having a plurality of semiconductor integrated circuit chips and a plurality of scribe lines, each of the semiconductor circuit chip having a plurality of chip pads and a passivation layer thereon;

forming a patterned conductor layer directly on the passivation layer;

forming an insulation layer on the patterned conductor layer;

forming a plurality of external terminals of the semiconductor package; and sawing the wafer to separate the semiconductor integrated circuit chips, wherein the patterned conductor layer connects the chip pads to respective external terminals, and the insulation layer includes a plurality of openings through which the external terminals connect to the patterned conductor layer.

2. The method of claim 1, wherein forming the external terminals comprises:

placing solder balls at the openings in the insulation layer so that each solder ball sits on an associated opening; and heating the solder balls to reshape the solder balls and attach the solder balls to the patterned conductor layer.

3. The method of claim 1, wherein forming the external terminals comprises:

screen-printing solder paste using a mask having a plurality of mask openings, each of the mask openings corresponding to a respective one of the openings in the insulation layer;

heating the solder paste to form solder bumps attached to bump pads formed in the patterned conductor layer.

4. The method of claim 1, wherein forming the patterned conductor layer comprises screen-printing a conductive paste and curing the paste.

5. The method of claim 1, wherein forming the patterned conductor layer comprises plating a metal layer and etching the metal layer.

6. The method of claim 1, wherein the insulation layer contains a polymeric material that is selected from a group consisting of benzocyclobutene, polyimide and epoxy resin.

7. The method of claim 1, further comprising forming a chip protection layer on a back side of the semiconductor wafer.

8. The method of claim 7, wherein the chip protection layer is formed by a spin-coating method.

9. The method of claim 1, further comprising forming a chip edge protection layer along scribe lines on a top surface of the semiconductor wafer.

10. The method of claim 9, wherein forming the chip edge protection layer comprises dispensing a liquid material on the scribe lines on the wafer.

11. A method for manufacturing a semiconductor package, comprising:

providing a semiconductor wafer having a plurality of semiconductor integrated circuit chips and a plurality of scribe lines, each of the semiconductor circuit chip having a plurality of chip pads and a passivation layer thereon;

forming a patterned conductor layer directly on the passivation layer;

forming an insulation layer on the patterned conductor layer;

forming a plurality of external terminals of the semiconductor package, wherein the insulation layer includes a plurality of openings through which the external terminals connect to the patterned conductor layer, and the patterned conductor layer connects the chip pads to respective external terminals;

forming a reinforcing layer on the insulation layer, wherein the external terminals are exposed through the reinforcing layer; and sawing the wafer to separate the semiconductor integrated circuit chips.

12. The method of claim 11, wherein the reinforcing layer is formed of a polymer.

13. The method of claim 12, wherein forming the reinforcing layer comprises dispensing a liquid polymer for the reinforcing layer and curing the polymer.

14. The method of claim 11, wherein the reinforcing layer is below a surface that connects the tips of the external terminals.

15. The method of claim 14, wherein a perpendicular distance from the surface to a point where the reinforcing layer meets the external terminals is about 100 µm.

16. A method for manufacturing a semiconductor package, comprising:

providing a semiconductor wafer having a plurality of semiconductor integrated circuit chips and a plurality of scribe lines, each of the semiconductor integrated circuit chips having a plurality of chip pads and a passivation layer thereon;

forming a lower insulation layer on the passivation layer of the semiconductor chip, the lower insulation layer having openings over the chip pads;

forming a patterned conductor layer which connects to the chip pads through the openings in the lower insulation layer;

forming an upper insulation layer on the patterned conductor layer, the upper insulation layer having openings which expose portions of the patterned conductor layer;

forming a plurality of external terminals of the semiconductor package at the openings in the upper insulation layer, the external terminals connecting to the patterned conductor layer, wherein the patterned conductor layer interconnects each of the chip pads to respective external terminals; forming a reinforcing layer on the upper insulation layer; and sawing the wafer to separate the semiconductor integrated circuit chips.

17. The method of claim 16, wherein the upper insulation layer contains a polymeric material which is one selected from a group consisting of benzocyclobutene, polyimide and epoxy resin.

18. The method of claim 16, wherein the lower insulation layer contains a polymeric material.

19. The method of claim 16, wherein the polymeric material is selected from a group consisting of benzocyclobutene, polyimide and epoxy resin.

20. The method of claim 16, wherein the lower insulation layer is formed of an inorganic material.

* * * * *